United States Patent
Yu et al.

(10) Patent No.: US 9,660,004 B2
(45) Date of Patent: May 23, 2017

(54) FLEXIBLE DISPLAYS WITH STRENGTHENED PAD AREA

(71) Applicant: Apple Inc., Cupertino, CA (US)

(72) Inventors: Da Yu, Santa Clara, CA (US); Jae Won Choi, Cupertino, CA (US); Sang Ha Kim, Dublin, CA (US); Vasudha Gupta, Cupertino, CA (US); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/497,086

(22) Filed: Sep. 25, 2014

(65) Prior Publication Data
US 2015/0268775 A1    Sep. 24, 2015

Related U.S. Application Data

(60) Provisional application No. 61/968,777, filed on Mar. 21, 2014.

(51) Int. Cl.
*H01L 51/56* (2006.01)
*H01L 27/32* (2006.01)
*H01L 51/52* (2006.01)

(52) U.S. Cl.
CPC ...... *H01L 27/3244* (2013.01); *H01L 27/3276* (2013.01); *H01L 51/5237* (2013.01);
(Continued)

(58) Field of Classification Search
CPC ......... G06F 3/0412; G06F 2203/04102; H01L 51/56; H01L 51/5237; H01L 27/3244; H01L 2227/323; H01L 2251/5338; H01L 51/5246; H01L 27/3276; H01L 51/5253; H01L 23/373; H01L 29/7842; H01L 2924/351; H01L 2924/3511;
(Continued)

(56) References Cited

U.S. PATENT DOCUMENTS

2007/0035239 A1    2/2007 Kang et al.
2007/0176549 A1*   8/2007 Park .................. C03C 8/02
                                                    313/512

(Continued)

FOREIGN PATENT DOCUMENTS

CN    101587900 A1    11/2009
WO    2014028128       2/2014

*Primary Examiner* — Kumar Patel
*Assistant Examiner* — Amy C Onyekaba
(74) *Attorney, Agent, or Firm* — Treyz Law Group, P.C.; Jason Tsai; Zachary D. Hadd

(57) ABSTRACT

An electronic device may have a flexible display with portions that can be bent. The display may include an array of display pixels in an active area. Contact pads may be formed in an inactive area of the display. Display circuitry in the active area may exhibit a given stack height, whereas display circuitry in the inactive area may exhibit a stack height that is less than the given stack height. In particular, the contact pads may be formed directly on a multi-buffer layer that sits directly on a flexible display substrate. Passivation material may be selectively formed only at the edges of the contact pad on the multi-buffer layer. The multi-buffer layer may be formed at a distance from the edge of the flexible display substrate to minimize cracking in the multi-buffer layer.

21 Claims, 14 Drawing Sheets

(52) U.S. Cl.
CPC ...... *H01L 51/5246* (2013.01); *H01L 51/5253* (2013.01); *H01L 51/56* (2013.01); *H01L 2251/5338* (2013.01)

(58) Field of Classification Search
CPC ... H01L 2924/3512; H01L 2924/35121; H01L 31/03926; H01L 41/0815; H01L 27/32; H01L 27/3258; H01L 27/326; H01L 27/3288; H01L 27/3297; H01L 51/50; H01L 51/52; H01L 51/5203; H01L 51/5209; H01L 51/5215; H01L 5/335; B81B 3/0072; B81B 3/00; B81B 3/0097
USPC ......................................................... 438/455
See application file for complete search history.

(56) References Cited

U.S. PATENT DOCUMENTS

| | | | |
|---|---|---|---|
| 2010/0096633 A1* | 4/2010 | Hatano | H01L 27/1214 257/59 |
| 2011/0177639 A1 | 7/2011 | Kang et al. | |
| 2012/0113346 A1* | 5/2012 | Choi | H01L 27/1225 349/43 |
| 2012/0146041 A1* | 6/2012 | Han | H01L 51/5246 257/72 |
| 2012/0218219 A1 | 8/2012 | Rappoport et al. | |
| 2012/0299147 A1* | 11/2012 | Mitani | H01L 21/2007 257/506 |
| 2013/0077034 A1* | 3/2013 | Jung | G02F 1/1345 349/122 |
| 2013/0270580 A1 | 10/2013 | Choi et al. | |
| 2014/0055702 A1 | 2/2014 | Park et al. | |
| 2014/0160695 A1 | 6/2014 | Jeong et al. | |
| 2014/0204286 A1 | 7/2014 | Park et al. | |
| 2014/0217373 A1* | 8/2014 | Youn | H01L 27/3276 257/40 |
| 2014/0299884 A1 | 10/2014 | Park et al. | |
| 2014/0374703 A1 | 12/2014 | Jung | |
| 2015/0001463 A1 | 1/2015 | Choi et al. | |

* cited by examiner

FLEXIBLE DISPLAYS WITH STRENGTHENED PAD AREA

This application claims the benefit of provisional patent application No. 61/968,777, filed Mar. 21, 2014, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

It can be challenging to form displays for electronic devices. Displays have active areas formed from arrays of display pixels. Inactive border regions surround the active regions. The inactive border region in a display contains support circuitry such as signal lines and thin-film transistor circuitry but does not contain active pixels for producing images for a user. To reduce the apparent size of the inactive border region, it may be desirable to use a flexible substrate in forming the display. This allows portions of the inactive border region to be bent out of sight, thereby reducing the size of the visible inactive display border and enhancing the appearance of the display.

A display driver integrated circuit (DIC) that is used to produce data and control signals for the display pixels can be formed on a separate DIC substrate. The separate substrate on which the display driver integrated circuit is formed can then be coupled to the display flexible substrate is corresponding bond pads. In particular, adhesive material can be deposited between the bonding regions where the display flexible substrate mates with the DIC substrate. The adhesive material can be activated via a thermal cycling process. Subjecting the adhesive material to thermal cycling can cause materials at the mating junction to expand and contract, resulting in tensile stress that can cause thin-film transistor layers on the flexible display substrate to be delaminated from the flexible substrate during the assembly process.

It would therefore be desirable to be able to provide improved displays that are more robust in the bonding region.

SUMMARY

An electronic device may be provided with a flexible display. The display may have portions that are bent. For example, the edges of the display may be bent to help hide inactive display components for view by a user of the electronic device.

The display may have display circuitry such as an array of display pixels in an active area of the display. The active area may, for example, have a rectangular shape. The display pixels may be coupled to contact pads such as bond pads formed in an inactive area of the display (sometimes referred to herein as the bonding area). A display driver integrated circuit (DIC) that is formed on a separate substrate may serve to generate data and control signals that are conveyed to the display pixels via the bond pads.

In particular, buffer layers sometimes referred to collectively as a multi-buffer layer, may be formed on a flexible display substrate (e.g., a polyimide substrate). Thin-film transistors structures such as thin-film transistors, a gate insulating layer, and interlayer dielectric layers may be formed in the active area of the substrate. These thin-film transistor structures may be removed from the bonding area so that the bond pads are formed directly on the buffer layers. Formed in this way, the active area may exhibit a stack height that is greater than that of the bonding area so that the bonding area experiences a reduced amount of stress during bonding and assembly operations.

If desired, the multi-buffer layer in the bonding area may have a thickness that is further reduced in comparison to that of the multi-buffer layer in the active area to further reduce bonding area stack height. In some arrangements, passivation material may be selectively formed only at the edges of the bond pads. The multi-buffer layer may be formed some distance away from an edge of the substrate so that the buffer layers experience compressive stress during the bonding process that couples the display driver integrated circuit to the bond pads.

For example, during the bonding process, crushed anisotropic conductive film (ACF) materials may be deposited on the bond pads. The crushed ACF material may be activated by raising the temperature to a predetermined threshold level during the bonding process. While the ACF material cools from the elevated temperature level back down to room temperature, the thermal expansion/contraction of the ACF and surrounding structures may apply compressive stress to the multi-buffer layer formed a distance away from the edge of the substrate. Applying compressive stress instead of tensile stress in this way minimizes cracking in the buffer layers and reduces the chance of peel-off.

Further features of the present invention, its nature and various advantages will be more apparent from the accompanying drawings and the following detailed description.

DETAILED DESCRIPTION

Displays are widely used in electronic devices. Displays may be based on plasma technology, organic-light-emitting-diode technology, liquid crystal structures, etc. Illustrative electronic devices that may be provided with displays are shown in FIGS. 1, 2, 3, and 4.

Figure 1:
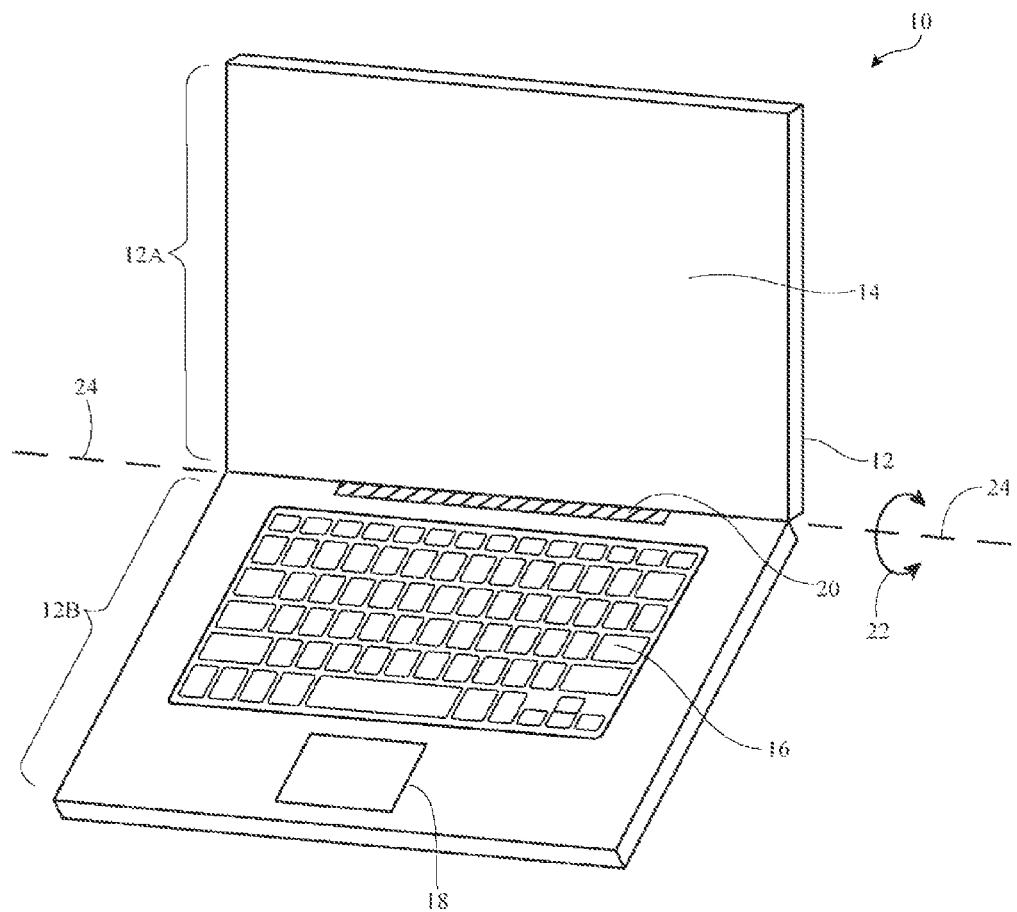
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
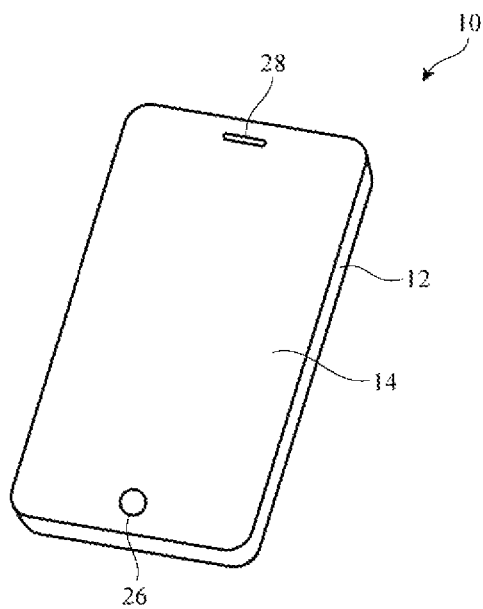
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a from face of housing 12. Display 14 may, if desired, have openings for components such as button 26. Openings may also be formed in display 14 to accommodate a speaker port (see, e.g., speaker port 28 of FIG. 2).

Figure 3:
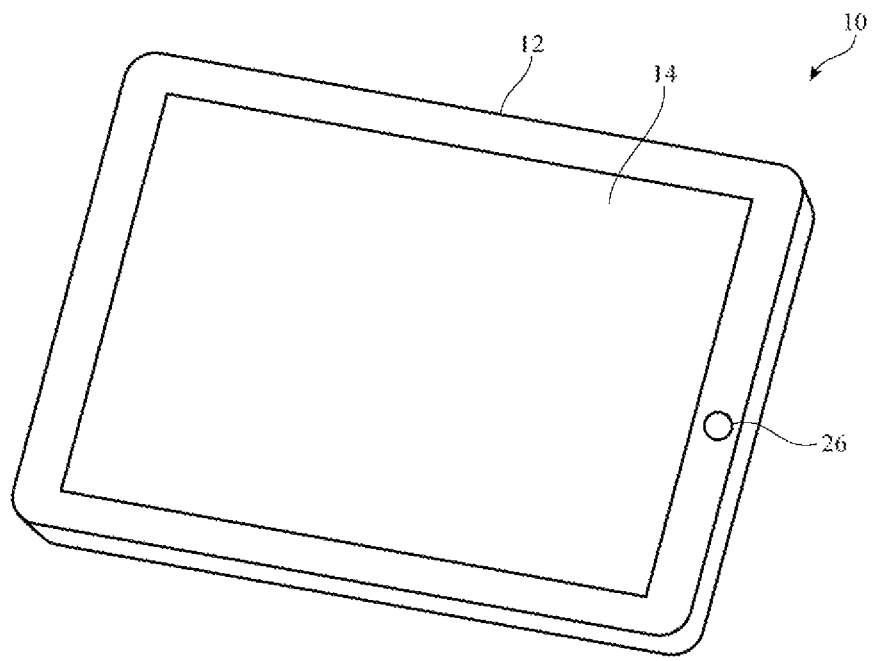
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
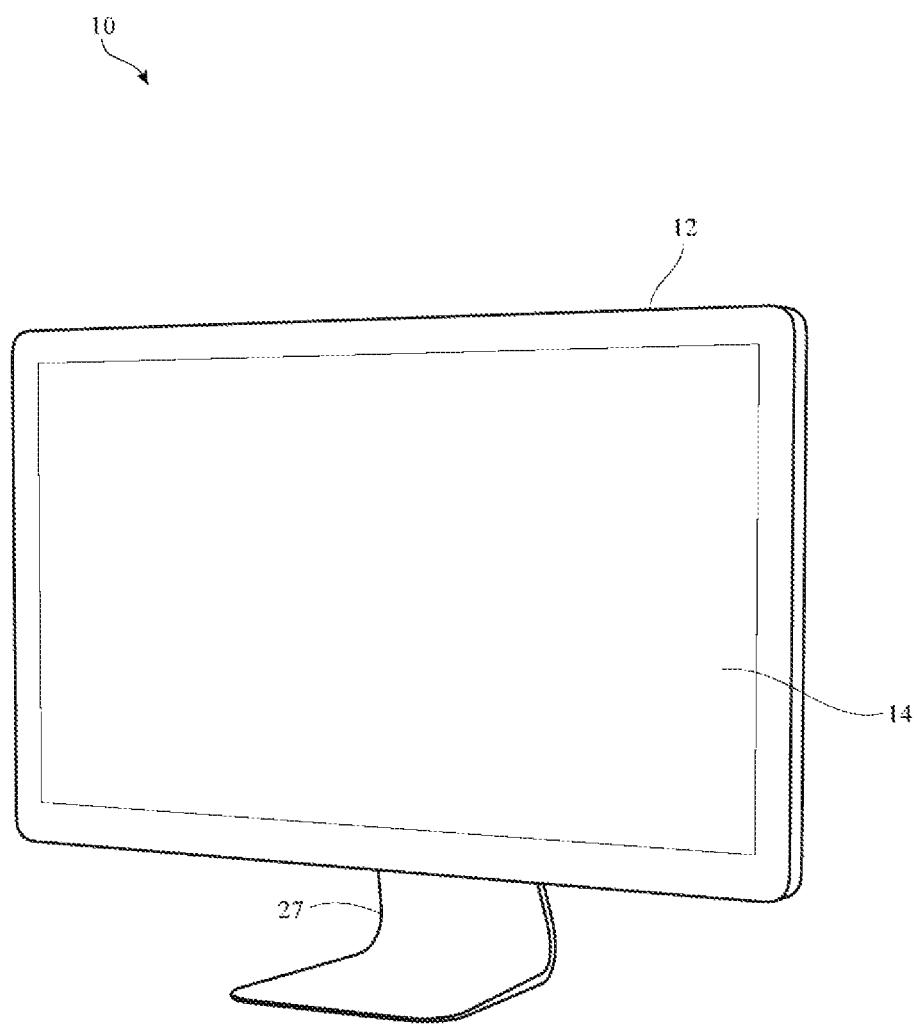
FIG. 4 is a perspective view of an illustrative electronic device such as a computer display with display structures in accordance with an embodiment of the present invention.

FIG. 4 shows how electronic device 10 may be a computer or television display or a computer that has been integrated into a display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass ceramics, carbon-fiber composites and other fiber-based composites, metal (e.g., machined aluminum stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing, structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 may include display pixels formed from organic light-emitting diode components or other suitable display pixel structures. An optional display cover layer such as a planar or curved transparent glass or plastic sheet or other transparent member may be cover the outer surface of display 14 (if desired). Edge portions of display 14 may be bent to hide inactive border regions of display 14 from view or display 14 may otherwise be provided with bend (curved) portions.

In one suitable arrangement, the display pixels in the active region of display 14 may be formed on a first flexible substrate, whereas a display driver chip that generates signals for controlling the display pixels in the active region may be formed on a second flexible substrate. First bond pads may be formed on the first flexible substrate. Second bond pads may be formed on the second flexible substrate. The first bond pads may be mated with the second bond pads so that the display driver chip is coupled to the display pixels in the active region.

To ensure that display 14 is not damaged during mating of the second flexible substrate to the first flexible substrate, the first bond pads on the first flexible substrate may be formed in a bond pad region with reduced thickness and may be formed at least some distance away from the outer edge of the first flexible substrate. This helps avoid damage to the bond pad region when coupling the first and second bond pads to one another.

Figure 5:
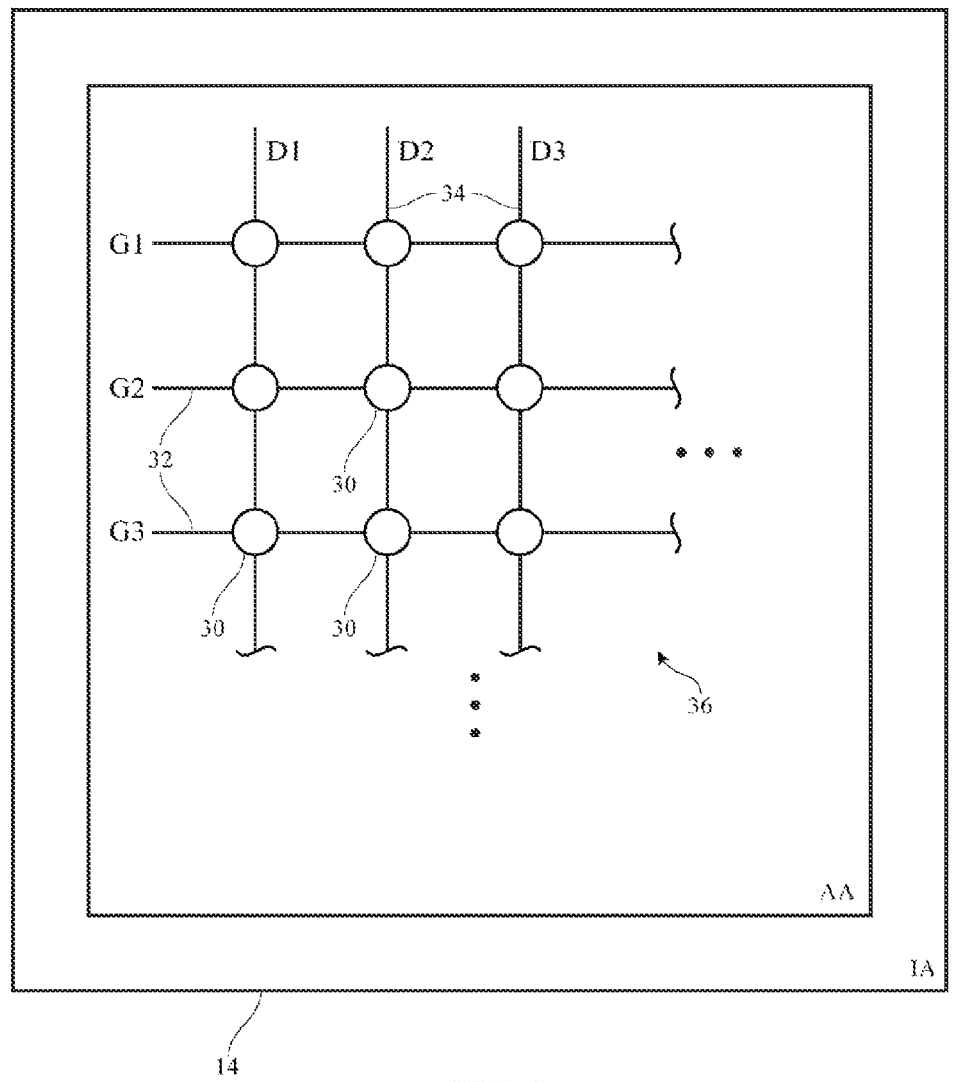
FIG. 5 is diagram of an array of display pixels in a display in accordance with an embodiment of the present invention.

FIG. 5 is a top view display 14. As shown in FIG. 5, display 14 may include display pixel array 36. Display pixel array 36 includes rows and columns of display pixels 30. Display pixels 30 may be, for example, organic light-emitting-diode pixels. Gate lines 32 and data lines 34 may be used to supply control signals to the array of display pixels 30. Display pixel array 36 may have a rectangular shape in the center of display 14. Display pixel array 36 may form an active region (active area AA) of display 14 that displays images to a user of device 10. The active area AA of display 14 may be surrounded by an inactive border region such as rectangular ring-shaped inactive area IA of FIG. 5. Inactive area IA may contain support circuitry such as thin-film transistors in display control circuitry and other thin-film transistor circuits, signal lines formed from metal traces, contact pads, and other display circuitry that does not emit light for creating images for the user.

Figure 6:
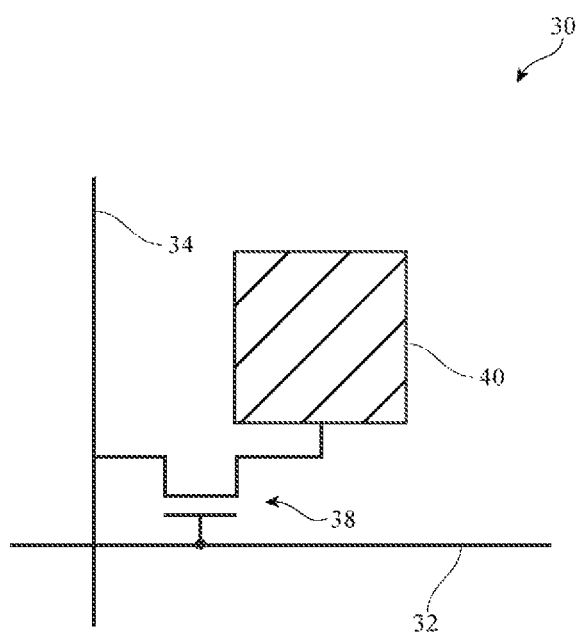
FIG. 6 is a circuit diagram of an illustrative display pixel in a display in accordance with an embodiment of the present invention.

FIG. 6 is a circuit diagram of an illustrative organic light-emitting diode display pixel 30. As shown in FIG. 6, display pixel 30 may have thin-film transistor circuitry such as one or more thin-film transistors 38. Thin-film transistor 38 in the example of FIG. 6 is coupled between one of data lines 34 and a patch of light-emitting organic material 40 and has a gate terminal coupled to one of gate lines 32. Other types of display pixels 30 may be used in display pixel array 36 of display 14 if desired (e.g., display pixels with two or more, three or more, or four or more transistors). The example of FIG. 6 is merely illustrative.

Figure 7:
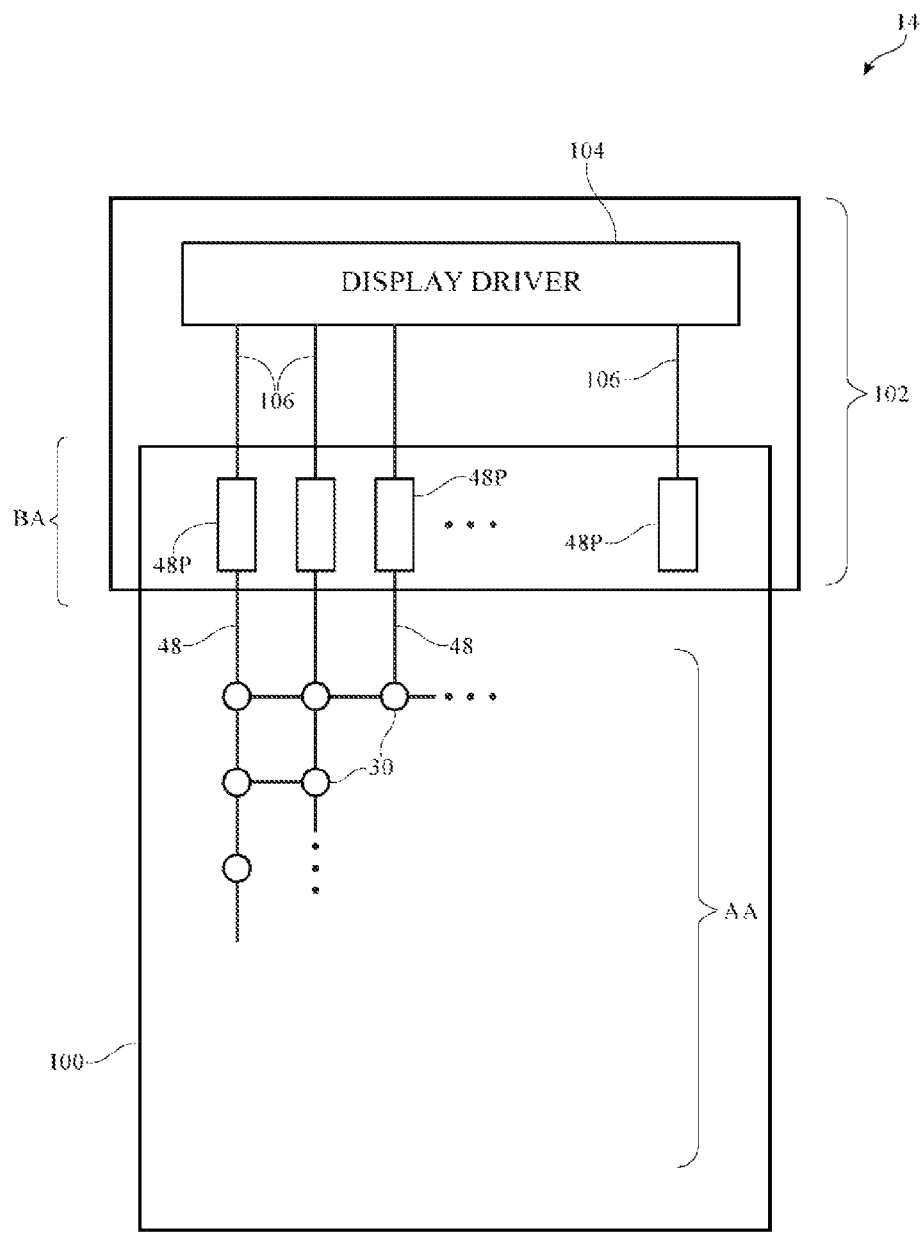
FIG. 7 is a diagram showing an array of display pixels that is coupled to a display driver integrated circuit via bond pads in accordance with an embodiment of the present invention.

FIG. 7 is a top view of display 14 in an illustrative configuration in which display pixels 30 are formed on a first substrate 100. Substrate 100 may be a rigid substrate or a flexible substrate. Substrate 100 that is flexible may have peripheral regions that are optionally bent to reduce the inactive border region surrounding the active region AA.

Display pixels 30 in active area AA may be used to display images to a user of device 10 (FIGS. 1-4). Display pixels 30 may be formed in an array (as an example) and may receive data and control signals via conductive lines such as conductive lines 48. Lines 48 may be formed from metal traces and may be coupled to control lines in the display pixel array such as data lines 34 and/or gate lines 32 (see. FIG. 5). Lines 48 may be coupled to respective contacts such as contacts 48P. Contacts 48P, which may sometimes be referred to as contact pads or bond pads, may be connected to integrated circuits, signal bus cables, connectors, and other circuits.

In the example of FIG. 7, a display driver integrated circuit (DIC) 104 may be provided on a separate substrate such as flexible substrate 102. Display driver 104 may serve to generate the data and control signals that are fed to display pixels 30 via lines 48. Display driver 104 may be coupled to contact pads 48P via conductive lines 106. Lines 106 may be metal traces that are formed in substrate 102. The arrangement in which the display driver is provided on a separate flexible substrate is sometimes referred to as "chip on flex" (COF).

The region in which bond pads 48P are formed and in which first flexible substrate 100 overlaps with second flexible substrate 102 may be referred to herein as the bonding region or bonding area BA. When handling display 14 having different substrates 100 and 102 bonded in this way, it is possible that the substrate bonding process itself or other system assembly operations can apply stress in bonding area BA. Force applied in this region can inadvertently cause damage to display circuitry formed on substrate 100 and or substrate 102.

Figure 8:
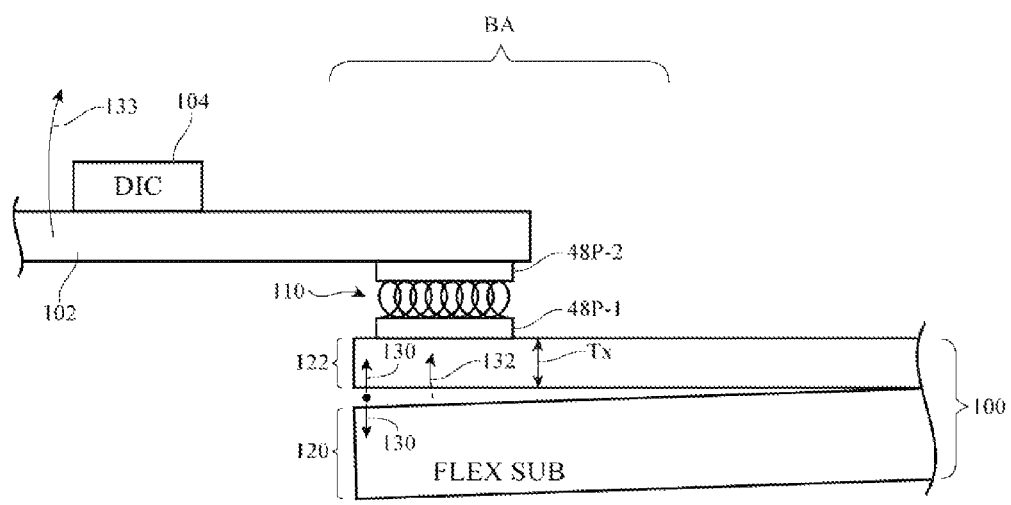
FIG. 8 is a cross-sectional side view showing how thin-film transistor (TFT) layers can be delaminated from a flexible display substrate in accordance with an embodiment of the present invention.

FIG. 8 shows the side view of the display circuitry of FIG. 7 at the bonding region. As shown in FIG. 8, substrate 100 may include a flexible substrate layer 120 (e.g., a substrate formed from polyimide or other flexible material) and thin-film transistor (TFT) layers 122 formed on flexible substrate layer 120. TFT layers 122 may include buffer layers, a gate oxide liner, dielectric layers formed over the gate oxide liner, and thin-film transistor structures such as conductive gate structures, active semiconductor material that is used to form TFT source-drain regions, conductive via structures, metal interconnect paths, and other circuit components (as examples).

A first bond pad 48P-1 may be formed on substrate 100 (i.e., bond pad 48P-1 may be formed directly on thin-film transistor layers 122). A second bond pad 48P-2 may be formed on substrate 102. Bond pads 48-1 formed on substrate 100 in this way may be coupled to active display pixel circuitry via conductive paths formed in substrate 100 (see, e.g., conductive paths 48 in FIG. 7), whereas bond pads 48-2 formed on substrate 102 in this way may be coupled to display driver chip 104 via conductive paths formed in substrate 102 (see, e.g., conductive paths 106 in FIG. 7).

Conductive adhesive material such as conductive adhesive material 110 may be formed between the overlapping portions of substrates 100 and 102 to bond contact pad 48P-1 to contact pad 48P-2. In one suitable embodiment, material 110 may be crushed anisotropic conductive film (ACF) material, which is an adhesive material that becomes locally conductive in areas where it is compressed at an elevated temperature level. For example, crushed ACF material 110 may be activated by raising the ACF material to 200° C. and by applying pressure on at least one of substrates 100 and 102 so that material 110 is compressed between the opposing bond pads 48P-1 and 48P-2. This is merely illustrative. If desired, any suitable type of bonding material may be used to couple substrate 102 to substrate 100.

Bonding substrate 102 to substrate 100 in this way may inadvertently induce stress within substrate 100. For example, while ACF material 110 is cooling down from 200° C. to room temperature, material 110 and surrounding structures may experience thermal contraction, which can result in tensile stress at the interface between substrate layer 120 and TFT layers 122, as indicated by arrows 130. Tensile stress 130 induced in this way can cause TFT layers 122 to delaminate from flexible substrate layer 120 (i.e., TFT layers 122 may peel off from substrate 120 in the direction of arrow 132). This example in which TFT layers 122 is delaminated from substrate layer 120 due to ACT bonding is merely illustrative. During other manufacturing operations in which display 14 is being assembled within housing 12 of device 10 (FIGS. 1-4), any force that is inadvertently applied by an assembly operator or machinery to substrate 102 in direction 133 may cause a peel-off force 132 that can also result in at least some of layers within substrate 100 to peel off or to be cracked/damaged.

One way of reducing the amount of stress on substrate 100 is to reduce the thickness Tx of TFT layers 122 in the bond pad region BA. Selectively reducing the TFT stack height Tx in the bonding area can help mitigate the amount of tensile stress and any peel off stress that is applied to layers 122 and can help minimize the probability that the bond pad region is damaged during bonding and handling operations.

Figure 9:
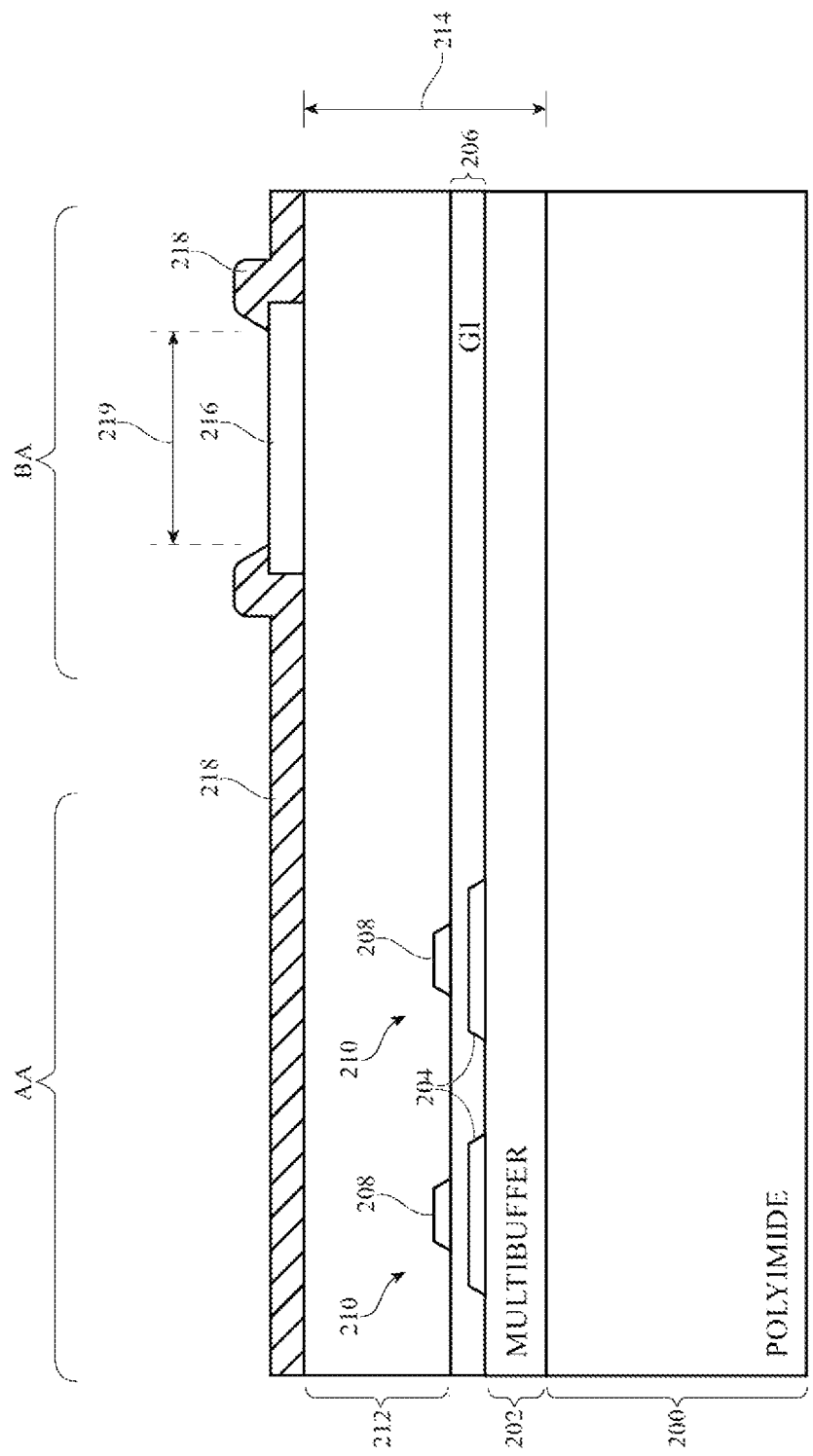
FIG. 9 is a cross-sectional side view of a conventional display having bond pads formed over a dielectric stack and a gate insulator.

FIG. 9 is a cross-sectional side view of conventional display circuitry having bond pads formed at the periphery of an active display region. As shown in FIG. 9, a multi-buffer layer 202 is formed on a polyimide substrate 200. Polysilicon material 204 is formed on layer 202. A gate insulating liner 206 is formed over the polysilicon material 204 on layer 202. Thin-film transistor metal gate conductors 208 are formed on gate insulating liner 206. Gate conductors 208 and associated polysilicon material 204 may collectively form thin-film transistors in active area AA. Oxide layers 212 (sometimes referred to as interlayer dielectric material or a dielectric stack) is formed over gate conductors 208 on gate liner 206. In the example of FIG. 9, layers 202, 206, and 212 may all be considered to be part of TFT layers 214.

Bond pad 216 is formed on oxide layers 212 in bond pad region BA. A blanket passivation layer 218 is then formed on oxide layers 212. A portion of bond pad 216 may be exposed (e.g., exposed bond pad portion 219) that allows conductive material such as ACF to make physical and electrical contact with bond pad 219. As shown in FIG. 9, the stack height of the active area AA is substantially equal to the stack height of the bonding area BA. Forming a display where the bonding region stack height is substantially equal to the active area stack height may be susceptible to TFT layer peel-off that is described in connection with FIG. 8.

Figure 10:
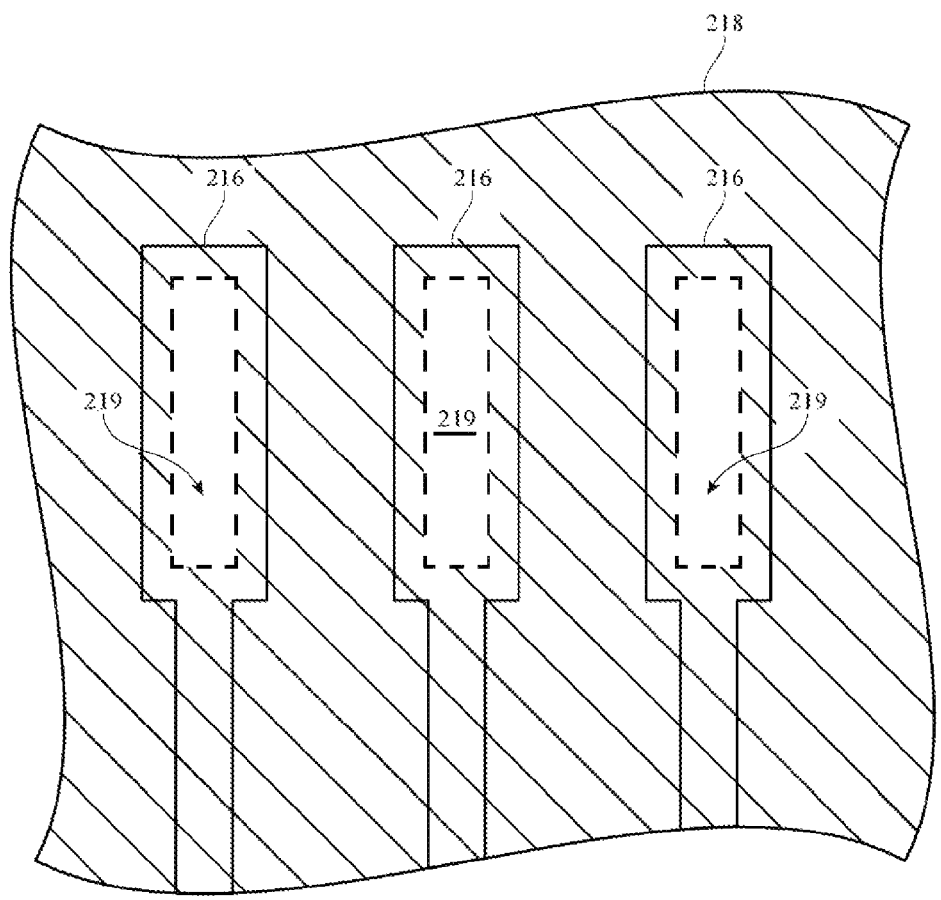
FIG. 10 is a top view showing a blanket passivation lay formed over the bond pads of FIG. 9.

FIG. 10 is a top view of the display circuitry of FIG. 9 showing multiple exposed bond pads 216. As shown in FIG. 10, each bond pad 216 has an exposed region 219. Areas other than these exposed regions 219 are covered by the blanket passivation layer 218. Forming a blanking passivation layer 218 using this approach further increases the stack height of the bonding region.

Figure 11:
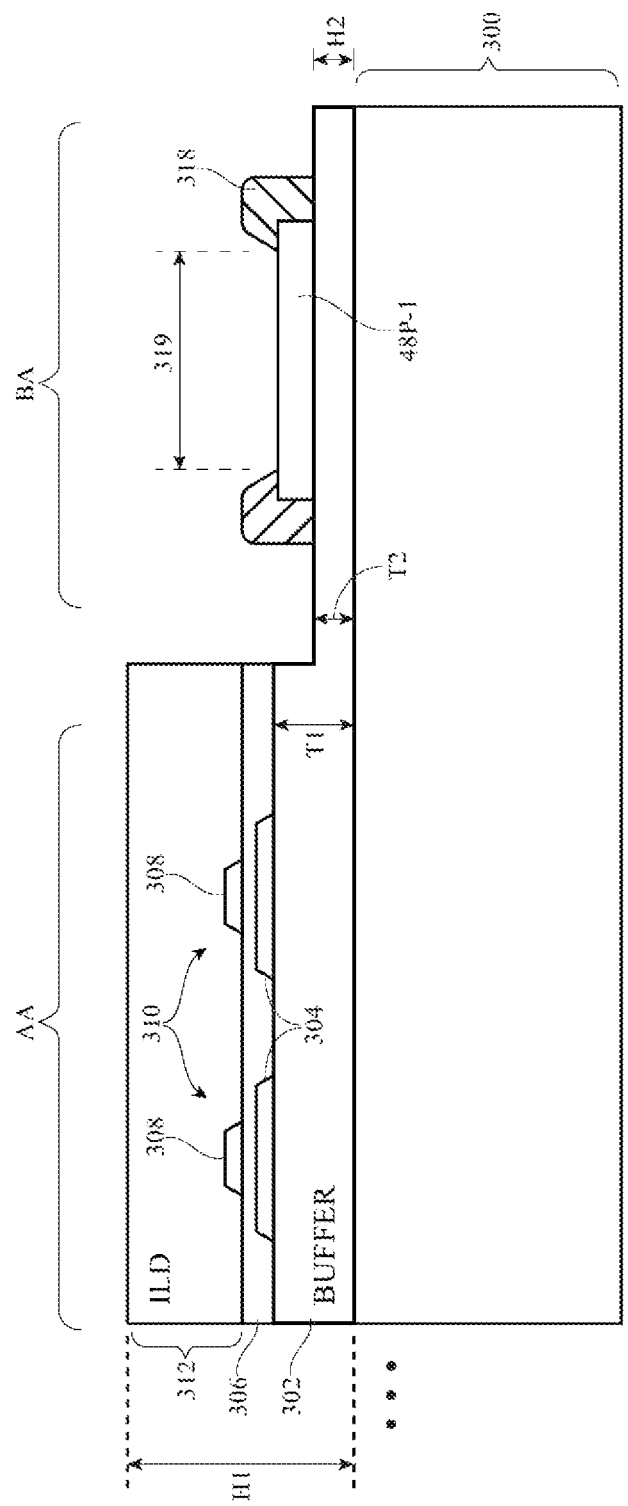
FIG. 11 is a cross-sectional side view of an illustrative display having bond pads formed in a region with reduced thickness in accordance with an embodiment of the present invention.

To provide reduced stress in the bonding region, display circuitry with reduced stack height in the bonding area is provided (see. e.g., FIG. 11). As shown in FIG. 11, buffer layers such as buffer layers 302 may be formed on substrate layer 300. Substrate layer 300 may be formed from polyimide or other suitable flexible substrate material. Substrate layer 300 may be formed from flexible substrate material to facilitate bending in the inactive region of display 14.

One or more buffer layers such as buffer layers 302 may be formed on substrate 300. Buffer layers 302 may include layers sometimes referred to as a multi-buffer (MB) layer, an active oxide layer (e.g., silicon oxide), an active nitride layer (e.g., silicon nitride), and other layers formed from any suitable transparent dielectric material. If desired, layers 302 ma include an inorganic buffer layer that serves to prevent chemicals such as etching solution from being injected into substrate 300 during subsequent formation of the TFT circuitry.

Active material 304 for transistors 310 may be formed on buffer layers 302. Active material 304 may be a layer of polysilicon, indium gallium zinc oxide, amorphous silicon, or other semiconducting material. A gate insulating layer such as gate insulating layer 306 may be formed on buffer layers 302 and over the active material. Gate insulator 306 may be formed form a dielectric such as silicon oxide. Conductive gate structure such as gate conductors 308 may be disposed over gating insulator 306. Gate conductors 308 may serve as the gate terminals for thin-film transistor 310. The portion of active material 304 lying directly beneath gate 308 may serve as the channel region for transistor 310.

One or more dielectric layers 312 may be formed over the thin-film transistor structures. Dielectric layers 312 may sometimes referred to as interlayer-dielectric (ILD) layers or collectively as a dielectric stack. Layers 312 may include alternating metal routing layers and via layers in which conductive metal routing paths and conductive via structures (not shown) can be formed, respectively. Transistors 310 formed in this way may serve as TFT transistors in the active pixel array (see, e.g., pixel transistor 38 in FIG. 6).

As shown in FIG. 11, the stack height H1 of the active area AA in which transistors 310 are formed is greater than the stack height H2 of the bonding area BA in which bond pad 48P-1 is formed. In the example of FIG. 11, bond pad 48P-1 is formed directly on multi-buffer layer 302. In order for bond pad 48-P to be formed directly on layer 302, gate insulator 306, dielectric layers 312, and any conductive gate structures have to be removed from bonding region BA before bond pad formation. In this particular example, buffer layers 302 in bonding region BA has a thickness T2 that is less than thickness T1 of buffer layers 302 in active region AA (e.g., multi-buffer layer 302 may be further thinned down to reduce bonding area stack height). This is merely illustrative. In other suitable arrangements, buffer layers 302 in both active area AA and bonding area BA may have the same thickness T1.

Figure 12:
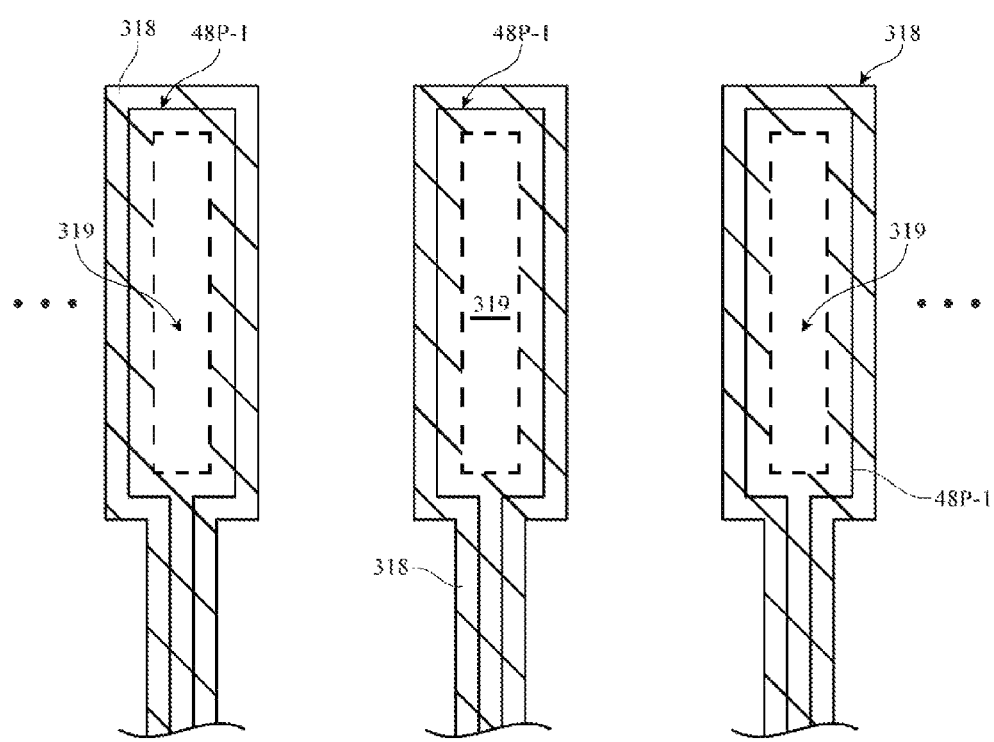
FIG. 12 is a top view showing passivation material that is only formed at the periphery of the bond pads in FIG. 11 in accordance with an embodiment of the present invention.

In contrast to the blanket passivation layer 218 of FIG. 10, passivation material 318 in FIG. 11 is only formed at the edges of bond pad 48P-1 on buffer layers 302 (e.g., passivation layer 318 may only be retained locally around the bond pads to prevent shorts between each adjacent pair of bond pads 48P-1). FIG. 12 is a top view showing how passivation material 318 is only formed at the perimeter of each pond pad 48P-1. A portion of each bond pad 48P-1 may be exposed (e.g., exposed bond pad portion 319) that allows conductive material such as ACF to make physical/electrical contact with pads 48P-1 during substrate bonding operations. Forming passivation layer 318 in this way can help provide better adhesion strength in the bonding area BA. If desired, a blanket passivation layer of the type described in FIG. 10 may also be formed over bond pads 48P-1.

Figure 13:
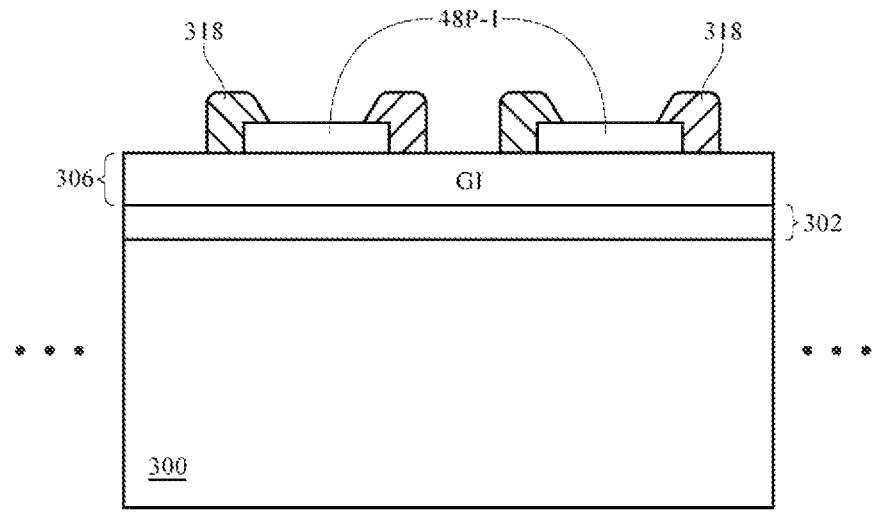
FIG. 13 is a cross-sectional side view of an illustrative display having bond pads formed on a gate insulating layer in accordance with an embodiment of the present invention.

The example of FIG. 11 in which the interlayer dielectric material 312 and the gate insulator 306 is removed from the bond pad region to reduce stack height is merely illustrative and does not serve to limit the scope of the present invention. In another suitable configuration, bond pads 48P-1 may be formed directly on the gate insulator 306 without any intervening interlayer dielectric material (see, e.g., FIG. 13). As shown in FIG. 13, gate insulator 306 may be interposed between the bond pads and multi-buffer layer 302 (e.g., the dielectric stack material may be removed before forming the bond pads). The removal of the dielectric stack itself in the bonding region may substantially reduce the bonding region stack height.

Figure 14:
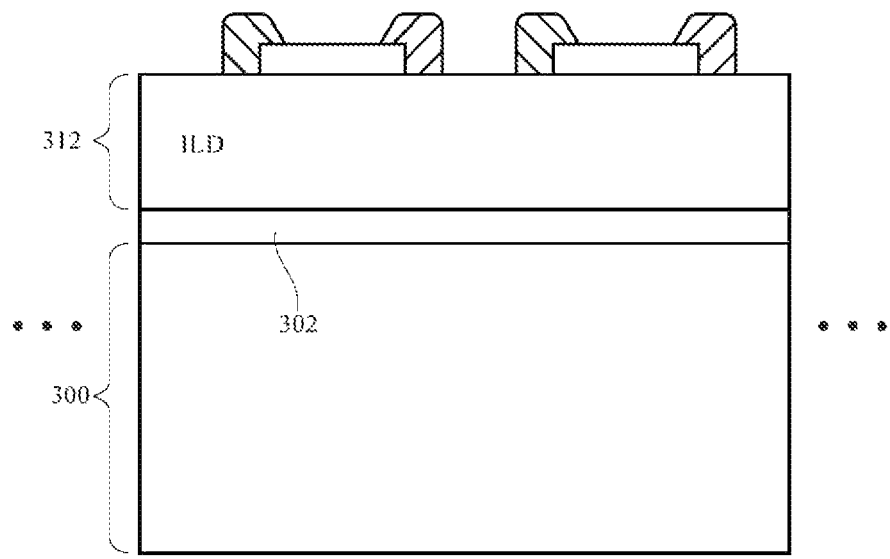
FIG. 14 is a cross-sectional side view of an illustrative display having bond pads formed on a dielectric gate in accordance with an embodiment of the present invention.

In yet another suitable configuration, bond pads 48P-1 may be formed on dielectric stack 312 (see, e.g., FIG. 14). As shown in FIG. 14, gate insulator 306 has been removed so that dielectric stack 312 sits directly on multi-buffer layer 302. The removal of the gate insulating liner in the bonding region may also help reduce the bonding region stack height. If desired, buffer layers 302 may be entirely removed from bonding area BA to reduce stack height. If desired, bond pads 48P-1 may be directly formed on flexible substrate layer 300 to minimize bond pad stack height.

Figure 15:
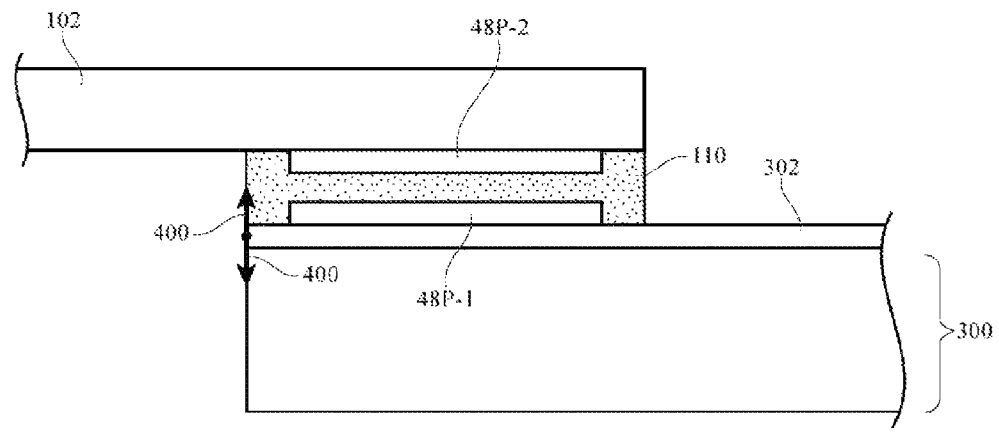
FIG. 15 is a side view showing how buffer layers on a flexible display substrate may be subject to tensile stress in accordance with an embodiment of the present invention.

Reducing stack height using the approaches described above can help reduce the level of stress in the bond pad region. Another way of minimizing the potential delaminatation of the TFT layers is to control the type of stress at the buffer to flexible substrate interface. FIG. 15 illustrates an arrangement in which buffer layers 302 extend all the way to the edge of flexible substrate 300. As shown in FIG. 15 bonding material such as ACF material 110 may be deposited in the bonding area where bond pads 48P-1 and 48P-2 face each other. In scenarios in which material 110 has to undergo thermal cycling (e.g., material 110 is activated by raising the temperature to more than 50° C., to more than 100° C., to more than 200° C., etc.). ACF 110 and nearby structures may experience thermal contraction when the temperature cools down from the elevated level back down to room temperature, which can result in tensile stress being applied within buffer layers 302, as indicated by arrows 400. Tensile stress generated in this way may contribute to cracking in buffer layers 102 and can also result in peel-off of buffer layers 102 from substrate 300.

Figure 16:
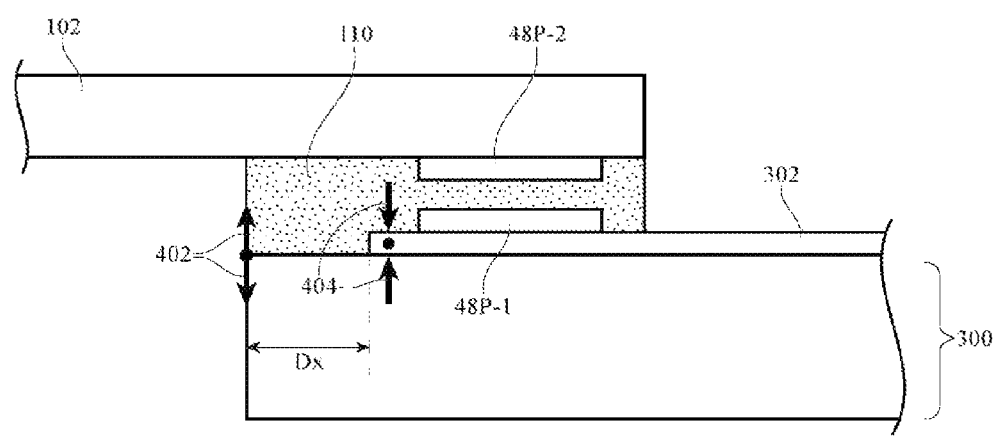
FIG. 16 is a side view showing how buffer layers formed at least some distance away from the edge of a flexible display substrate may be subject to compressive stress in accordance with an embodiment of the present invention.

In one suitable embodiment, buffer layers 302 may be formed at least some distance away from the edge of substrate 300 to help minimize cracking of buffer layers 102 (see, e.g., FIG. 16). As shown in FIG. 16, buffer layers 102 may be formed at a distance Dx away from the edge of substrate 300. Bond pad 48P-1 may still be formed only on buffer layers 302 in the bonding region. Formed in this way, a portion of flexible substrate 300 may be exposed and make direct physical contact with bonding material 110.

In scenarios in which material 110 has to undergo thermal cycling (e.g., material 110 has to be raised to a predetermined elevated temperature level and then cooled back down to room temperature), ACF 110 and nearby structures may experience thermal contraction when the temperature cools down from the elevated level back down to room temperature, which can result in tensile stress being applied at the ACF to flexible substrate interface, as indicated by arrows 402. Tensile stress generated in this way may induce compressive stress in the buffer layers 302 (as indicated by arrows 404). Compressive stress applied to layers 302 minimizes the chance of cracking in buffer layers 102, which reduces the chance of damage in the bonding region.

In general, the distance Dx at which buffer layers 302 is separated from the edge of substrate 300 can be tuned to optimize the type and amount of stress that is being experienced at the interface of buffer layers 302 and substrate 300. For example, increasing distance Dx may increase the amount of compressive stress 404 that is experienced by buffer layers 302, whereas decreasing the distance Dx may decrease the amount of compressive stress 404 that is experienced by buffer layers 302. It may be desirable for buffer layers 302 is experience some compressive stress that is less than some predetermined level of stress to minimize the chance of crack at the butter to flexible substrate interface and to minimize the chance of peel-off.

Figure 17:
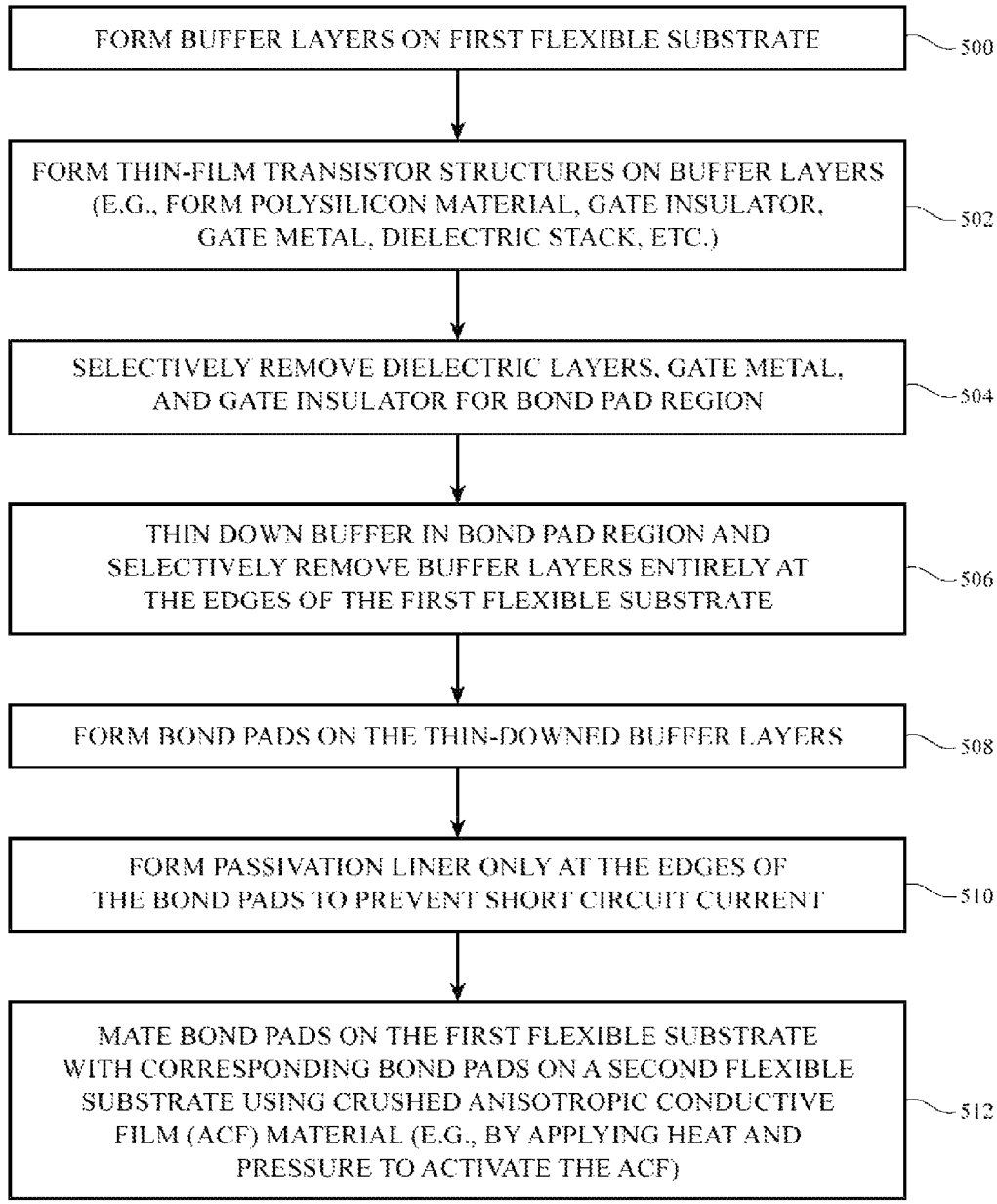
FIG. 17 is a flow chart of illustrative steps for forming display circuitry of the type described in connection with FIGS. 11-16 in accordance with an embodiment of the present invention.

FIG. 17 shows illustrative steps involved in manufacturing display circuitry of the type described in connection with FIGS. 11-16. At step 500, one or more buffer layers 302 may be formed on a first flexible substrate 300. At step 502, thin-film transistor (TFT) structures may be formed over buffer layers 302. For example, polysilicon or other active semiconductor material 304, gate insulating material 306 gate metal structures 308, and interlayer dielectric (ILD) layers 312 may be formed over buffer layers.

At step 504, the dielectric layers 312, gate metal structures 308, gate insulator 306, and other TFT structures may be selectively removed from the bond pad region. This is merely illustrative. If desired, dielectric layers 312, gate metal structures 308, gate insulator 306, and other TFT structures may never have been formed after formation of buffer layers 302 by selectively blocking out the bond pad region using a mask.

At step 506, buffer layers 302 in the bond pad region can be optionally thinned down so that the thickness T2 of layers 302 in bonding area BA is less than the thickness T1 of layers 302 in active area AA. During this step, a portion of buffer layers 302 near the edges of substrate 300 may be entirely removed to expose a portion of substrate 300 (e.g., so that buffer layers 302 sits at a distance Dx from the edge of substrate 300).

At step 508, bond pads 48P-1 may be formed on the thin-downed buffer layers 302 in the bonding region. At step 510, passivation liner 318 may be selectively formed only at the edges of the bond pads to prevent short circuit current from flowing between adjacent bond pads. For example, a blanket passivation layer may first be deposited, and portions of the passivation layer that are away from the edges of the bond pads and at the center of each bond pad may be selectively etched away to expose the underlying buffer layers 302 and bond pad, respectively.

At step 512, bond pads 48P-1 may be bonded with corresponding bond pads 48P-2 that are formed on flexible substrate 102 using bonding material such as crushed ACF. The crushed ACF material may be activated by applying heat and pressure so that bond pads 48P-1 and 48P-2 are electrically coupled and physically adhered to one another.

The foregoing is merely illustrative of the principles of this invention and various modifications can be made by those skilled in the art without departing from the scope and spirit of the invention. The foregoing embodiments may be implemented individually or in any combination.

What is claimed is:

1. Display circuitry for a display having an active area and an inactive bonding area, the display circuitry comprising:
   a substrate;
   transistors in the active area, wherein the transistors comprise gate conductors and active semiconductor material;
   buffer layers formed on the substrate wherein, in the active area, each of the buffer layers is interposed between the gate conductors and the substrate and between the active semiconductor material and the substrate, wherein each of the buffer layers extends into the inactive bonding area, and wherein each of the buffer layers is formed at a distance away from an edge of the substrate in the inactive bonding area so that a portion of the substrate in the inactive bonding area is not covered by the buffer layers;
   display pixels formed over the buffer layers within the active area; and
   a bond pad formed directly on the buffer layers.

2. The display circuitry defined in claim 1, further comprising:
   gate insulating material formed on the buffer layers within the active area.

3. The display circuitry defined in claim 2, further comprising:
   a dielectric stack formed on the gate insulating material within the active area.

4. The display circuitry defined in claim 1, wherein the bond pad is formed within the inactive bonding area, wherein the active area has a first stack height, and wherein the inactive bonding area has a second stack height that is less than the first stack height.

5. The display circuitry defined in 1, wherein the bond pad is formed within the inactive bonding area, wherein the buffer layers in the active area has a first thickness, and wherein the buffer layers in the inactive bonding area has a second thickness that is less than the first thickness.

6. The display circuitry defined in claim 1, further comprising:
   passivation material formed only at the edges of the bond pad on the buffer layers.

7. The display circuitry defined in claim 1, further comprising:
   an additional substrate on which an additional bond pad is formed; and
   bonding material interposed between the bond pad on the substrate and the additional bond pad on the additional substrate, wherein the bonding material directly contacts the portion of the substrate in the inactive bonding area that is not covered by the buffer layers.

8. The display circuitry defined in claim 7, wherein the substrate and the additional substrate comprise flexible substrates.

9. Display circuitry, comprising:
   a substrate;
   display pixels formed in an active region on the substrate;
   bond pads formed in an inactive region on the substrate, wherein the active region of the substrate exhibits a first stack height, wherein the inactive region of the substrate exhibits a second stack height that is different than the first stack height;

a multi-buffer layer formed directly on the substrate, wherein active semiconductor material for the display pixels is formed directly on a first portion of the multi-buffer layer in the active region that has a first thickness, and wherein a second portion of the multi-buffer layer in the inactive region has a second thickness that is less than the first thickness; and a passivation layer that overlaps edges of the bond pads in the inactive region without extending into the active region.

10. The display circuitry defined in claim 9, wherein the first stack height is greater than the second stack height.

11. The display circuitry defined in claim 9, wherein the bond pads are formed directly on the second portion of the multi-buffer layer.

12. The display circuitry defined in claim 9, further comprising:
an additional substrate; and
a display driver integrated circuit formed on the additional substrate, wherein the display driver integrated circuit is coupled to the display pixels via the bond pads.

13. The display circuitry defined in claim 9, wherein the passivation layer is formed directly on the multi-buffer layer and directly on the edges of the bond pads.

14. The display circuitry defined in claim 9, further comprising:
gate conductors in the active region of the substrate, wherein the active semiconductor material is interposed between the gate conductors and the multi-buffer layer;
a gate insulating layer interposed between the gate conductors and the active semiconductor material; and
an interlayer dielectric layer, wherein the gate conductors are interposed between the interlayer dielectric layer and the gate insulating layer.

15. The display circuitry defined in claim 14, wherein the interlayer dielectric layer does not extend into the inactive region and wherein the bond pads are formed directly on the gate insulating layer in the inactive region.

16. The display circuitry defined in claim 14, wherein the gate insulating layer does not extend into the inactive region and wherein the bond pads are formed directly on the interlayer dielectric layer in the inactive region.

17. A method for manufacturing a display, comprising:
forming display pixels in an active area on a substrate;
forming bond pads in an inactive bonding area on the substrate;
forming a multi-buffer layer directly on the substrate;
selectively removing at least some layers in the inactive bonding area so that the inactive bonding area exhibits a first stack height that is less than a second stack height of the active area, wherein selectively removing the at least some layers in the inactive bonding area comprises selectively removing at least some of the multi-buffer layer so that a first portion of the multi-buffer layer in the active area has a first thickness and a second portion of the multi-buffer layer in the inactive bonding area has a second thickness that is less than the first thickness;
forming active semiconductor material for the display pixels on the first portion; and
forming a passivation layer that overlaps edges of the bond pads in the inactive bonding area without extending in to the active area.

18. The method defined in claim 17, further comprising:
forming a gate insulating layer over the substrate; and
forming interlayer dielectric layers over the substrate, wherein selectively removing the at least some layers in the inactive bonding area comprises selectively removing the interlayer dielectric layers and the gate insulating layer in the inactive bonding area while leaving the interlayer dielectric layers and the gate insulating layer in the active area intact.

19. The method defined in claim 17, further comprising:
forming the passivation layer only at the edges of the bond pads.

20. The method defined in claim 17, further comprising:
bonding the bond pad on the substrate to corresponding bond pads on another substrate, wherein forming the multi-buffer layer comprises forming the multi-buffer layer at some distance away from an edge of the substrate so that the multi-buffer layer experiences compressive stress during the bonding process.

21. The method defined in claim 20, wherein bonding the bond pad to the corresponding bond pads on the another substrate comprises depositing crushed anisotropic conductive film (ACF) material on the bond pads and raising the temperature of the crushed ACF during the bonding process.

* * * * *